United States Patent
Lakkis

(10) Patent No.: US 8,910,027 B2
(45) Date of Patent: Dec. 9, 2014

(54) GOLAY-CODE GENERATION

(75) Inventor: Ismail Lakkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1347 days.

(21) Appl. No.: 11/599,725

(22) Filed: Nov. 15, 2006

(65) Prior Publication Data

US 2007/0113159 A1   May 17, 2007

Related U.S. Application Data

(60) Provisional application No. 60/737,065, filed on Nov. 16, 2005.

(51) Int. Cl.
*H03M 13/15* (2006.01)
*H03M 13/00* (2006.01)

(52) U.S. Cl.
CPC ........ *H03M 13/1505* (2013.01); *H03M 13/611* (2013.01); *H03M 13/618* (2013.01)
USPC .......................................... 714/783; 714/758

(58) Field of Classification Search
USPC ................................................ 714/783, 758
See application file for complete search history.

(56) References Cited

U.S. PATENT DOCUMENTS

| | | | | |
|---|---|---|---|---|
| 3,622,982 A | * | 11/1971 | Clark et al. .................... | 714/783 |
| 4,346,475 A | | 8/1982 | Alexis | |
| 4,397,022 A | * | 8/1983 | Weng et al. .................... | 714/783 |
| 4,849,976 A | | 7/1989 | Schilling et al. | |
| 4,901,317 A | * | 2/1990 | Rushforth et al. ............ | 714/783 |
| 4,926,422 A | | 5/1990 | Alaria et al. | |
| 4,933,956 A | * | 6/1990 | Forney, Jr. ..................... | 375/341 |
| 5,717,871 A | | 2/1998 | Hsieh et al. | |
| 5,805,613 A | * | 9/1998 | Beery et al. ................... | 714/752 |
| 5,914,933 A | | 6/1999 | Cimini et al. | |
| 5,968,199 A | * | 10/1999 | Khayrallah et al. .......... | 714/783 |

(Continued)

FOREIGN PATENT DOCUMENTS

| | | |
|---|---|---|
| CN | 1599300 A | 3/2005 |
| CN | 101027712 A | 8/2007 |

(Continued)

OTHER PUBLICATIONS

Sivaswamy, R. "Multiphase Complementary Codes," IEEE Transactions on Information Theory, vol. IT-24, No. 5, Sep. 1978.

(Continued)

*Primary Examiner* — M. Mujtaba K Chaudry
(74) *Attorney, Agent, or Firm* — Dang M. Vo

(57) ABSTRACT

A Golay-code generator configured for generating Golay complementary code pairs comprises a sequence of delay elements configured for providing a predetermined set of fixed delays to at least a first input signal and a sequence of adaptable seed vector insertion elements configured for multiplying at least a second input signal by a variable seed vector, wherein each of a plurality of seed vectors corresponds to at least one predetermined piconet. The Golay-code generator may further comprise multiplexers configured for switching inputs and outputs of at least two delay elements in the sequence of delay elements to produce a plurality of compatible delay vectors. The Golay-code generator may further comprise a code-truncation module configured to shorten the Golay complementary code pairs for producing a plurality of daughter codes.

24 Claims, 12 Drawing Sheets

(56) References Cited

U.S. PATENT DOCUMENTS

| | | | |
|---|---|---|---|
| 6,005,840 A | 12/1999 | Awater et al. | |
| 6,134,261 A | 10/2000 | Ryan | |
| 6,189,125 B1* | 2/2001 | Classon | 714/783 |
| 6,324,668 B1* | 11/2001 | Classon | 714/783 |
| 6,404,732 B1 | 6/2002 | Van Nee | |
| 6,452,958 B1 | 9/2002 | Van Nee | |
| 6,453,168 B1 | 9/2002 | McCrady et al. | |
| 6,567,482 B1 | 5/2003 | Popovic' | |
| 6,643,281 B1 | 11/2003 | Ryan | |
| 6,658,632 B1 | 12/2003 | Parulkar et al. | |
| 6,661,854 B2 | 12/2003 | Rudolf et al. | |
| 6,674,819 B2 | 1/2004 | Rudolf et al. | |
| 6,795,513 B2 | 9/2004 | Jechoux et al. | |
| 6,804,191 B2 | 10/2004 | Richardson | |
| 6,839,876 B1* | 1/2005 | Tong et al. | 714/783 |
| 6,895,258 B1 | 5/2005 | Scherzer et al. | |
| 6,922,406 B2* | 7/2005 | Rudolf et al. | 370/350 |
| 6,977,974 B1 | 12/2005 | Geraniotis et al. | |
| 6,996,418 B2 | 2/2006 | Teo et al. | |
| 7,010,071 B1* | 3/2006 | Michel et al. | 375/354 |
| 7,039,036 B1 | 5/2006 | Dabak et al. | |
| 7,042,868 B2 | 5/2006 | Runkle et al. | |
| 7,062,002 B1 | 6/2006 | Michel et al. | |
| 7,106,787 B2 | 9/2006 | Chang et al. | |
| 7,116,650 B2 | 10/2006 | Takeuchi et al. | |
| 7,130,586 B2 | 10/2006 | Corbett et al. | |
| 7,289,588 B2* | 10/2007 | Suh et al. | 375/367 |
| 7,292,641 B2 | 11/2007 | Suh et al. | |
| 7,356,008 B2 | 4/2008 | Mottier et al. | |
| 7,400,654 B2 | 7/2008 | Raaf | |
| 7,483,367 B2* | 1/2009 | Chayat et al. | 370/208 |
| 7,486,737 B2 | 2/2009 | Trainin et al. | |
| 7,508,866 B2 | 3/2009 | Chang et al. | |
| 7,616,622 B2* | 11/2009 | Rudolf et al. | 370/350 |
| 7,680,230 B2 | 3/2010 | Koppelaar | |
| 7,684,473 B2 | 3/2010 | Walton et al. | |
| 7,711,032 B2 | 5/2010 | Diaz Fuente | |
| 7,817,967 B2 | 10/2010 | Karabinis et al. | |
| 8,527,853 B2 | 9/2013 | Lakkis | |
| 2004/0071195 A1 | 4/2004 | Huang et al. | |
| 2004/0213145 A1 | 10/2004 | Nakamura | |
| 2006/0245505 A1 | 11/2006 | Limberg | |
| 2007/0014331 A1 | 1/2007 | Eldon et al. | |
| 2007/0053652 A1 | 3/2007 | Mignard et al. | |
| 2007/0168841 A1 | 7/2007 | Lakkis | |
| 2007/0245221 A1 | 10/2007 | Lakkis | |
| 2009/0097533 A1 | 4/2009 | Lakkis | |
| 2009/0100316 A1 | 4/2009 | Lakkis | |
| 2009/0100317 A1 | 4/2009 | Lakkis | |
| 2009/0110031 A1 | 4/2009 | Lakkis | |
| 2009/0125792 A1 | 5/2009 | Lakkis | |
| 2009/0201974 A1 | 8/2009 | Song et al. | |
| 2011/0209035 A1 | 8/2011 | Lakkis | |

FOREIGN PATENT DOCUMENTS

| | | |
|---|---|---|
| CN | 101035105 A | 9/2007 |
| EP | 1640962 A2 | 3/2006 |
| EP | 1953924 A1 | 8/2008 |
| JP | 2002280942 A | 9/2002 |
| JP | 2004515935 A | 5/2004 |
| JP | 2004364285 A | 12/2004 |
| WO | WO03047140 A1 | 6/2003 |
| WO | WO2007056948 A1 | 5/2007 |

OTHER PUBLICATIONS

IEEE 802.11b, "Part 11: Wireless LAN Medium Access Control (MAC) and Physical Layer (PHY) specifications: Higher-Speed Physical Layer Extension in the 2.4 GHz Band," Sep. 16, 1999.

Budisin, S.Z., "Efficient pulse compressor for Golay complementary sequences," Electronic Letters, 27, No. 3, pp. 219-220, Jan. 31, 1991.

Cheolhee Park et al: "Short-Range Wireless Communications for Next-Generation Networks: UWB, 60 GHz Millimeter-Wave WPAN, And ZigBee" IEEE Wireless Communications, IEEE Service Center, Piscataway, NJ, US, col. 14, No. 4, Aug. 1, 2007, XP011191781.

Domenico Antonio Fittipaldi et al: "ieee 802.15.3c Medium Access Controller Throughput for Phased Array Systems" IEEE International Symposium on Personal Indoor and Mobile Radio Communications. PIMRC, IEEE; PI, XX Sep. 1, 2007 XP031168545.

Fumihide Kojima et al: "Necessary Modifications on Conventional IEEE802,15.3b MAC to Achieve IEEE802.15.3c Millimeter Wave WPAN" IEEE International Symposium on Personal, Indoor and Mobile Radio Communications. PIMRC, IEEE; PI, XX, Sep. 1, 2007, XP031168693.

Golay M J E: "Complementary Series" IRE Transactions on Information Theory, IEEE Inc, New York, US, vol. IT-07, No. 2, Apr. 1, 1961, XP009050014.

Guangqi Yang et al: "Design of Synchoronization Sequences in a MIMO Demonstration System" Wireless Communications and Applied Computational Electromagnetics, 20 05. IEEE/ACES International Conference on Honolulu, Hi Apr. 3-7, 2005, Piscataway, NJ, USA IEEE, Apr. 3, 2005. pp. 40-43, XP010826457.

Hiroshi Harada: "IEEE 802.15-07-0761-10-003c Unified and flexible millimeter wave WPAN systems supported by common mode" TG3C, Sep. 18, 2007 XP002506475.

Lakkis I. et al: "IEEE 802.15-0760-03-003c mmWave OFDM Physical Layer Proposal" IEEE 802 TG3C, Sep. 19, 2007 19, XP002507726.

Nortel Networks: "Clarifications on Golay-Hadamard Sequence Based RACH Preamble" 3GPP Draft; R1-99C28, 3rd Generation Partnership Project (3GPP), Mobile Competence Centre; 650, Route Des Lucioles: F-06921 Sophia-Anitpolis Cedex: France, vol.tsg_ran\WG1_RL1/TSGR1_07/Docs/Pdfs, no. Hannover; 19990830, Aug. 26, 1999, XP050089422.

Pengfei Xia et al: "Short Range Gigabit Wireless Communications Systems: Potentials, Challenges and Techniques" Ultra_Wideband, 2007, ICUWB 2007 IEEE International Conterence on, IEEE, PI Sep. 1, 2007 XP03115933.

Ryuhei Funada et al: "A design of single carrier based PHY for IEEE 802.15.3c standard" IEEE International Symposium on Personal Indoor and Mobile Radio Communications. PIMRC, IEEE; PI, XX, Sep. 1, 2007, XP031168950.

IEEE 802.15.3c, "Part 15.3: Wireless Medium Access Control (MAC) and Physical Layer (PHY) Specifications for High Rate Wireless Personal Area Networks (WPANs)," Amendment 2: Millimeter-wave-based, Alternative Physical Layer Extension, (Amendment to IEEE Std 802.15.3-2003), Oct. 12, 2009.

Chung, "Optical Orthogonal codes: Design, Analysis and Applications", May 1989, IEEE vol. 35 No. 3, p. 595-604.

Bulumulla, "A systematic approach to detecting OFMD signals in a fading channel", May 2000, IEEE, Vo. 48 No. 5, pp. 1-4.

* cited by examiner

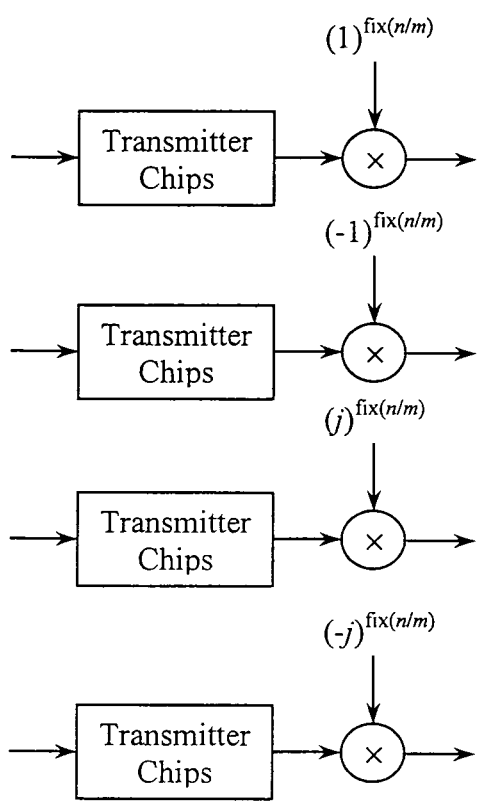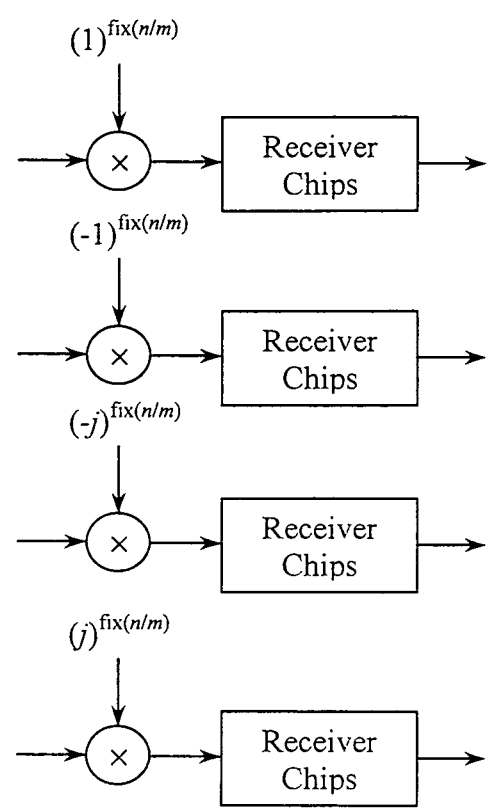
FIGURE 9A                    FIGURE 9B

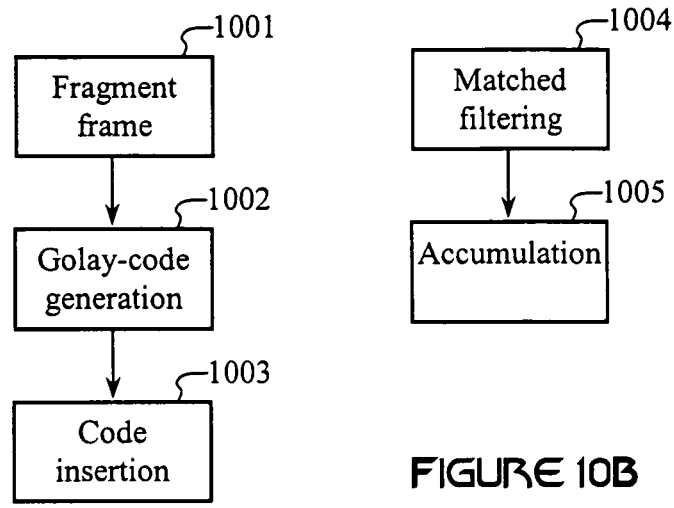
FIGURE 10A
FIGURE 10B
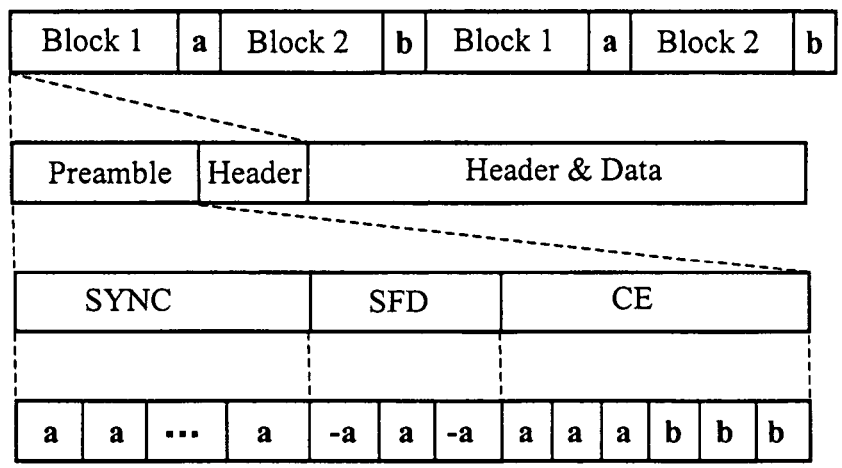
FIGURE 10C

GOLAY-CODE GENERATION

CROSS-REFERENCE TO RELATED APPLICATION

This application claims priority to commonly owned and co-pending U.S. Patent Application Ser. No. 60/737,065, filed Nov. 16, 2005, entitled "High Data Rate Ultra-Wide Band."

BACKGROUND OF THE INVENTION

I. Field of the Invention

The present invention relates generally to generating spread-spectrum coding, and particularly to generating and processing Golay codes.

II. Description of the Related Art

Within UWB communications, several different types of networks, each with their own communication protocols are envisioned. For example, there are Local Area Networks (LANs), Personal Area Networks (PANs), Wireless Personal Area Networks (WPANs), sensor networks and others. Each network may have its own communication protocol.

The spectrum allocated in the United States for UWB is from 3,100 MHz to 10,600 MHz (7,500 MHz bandwidth). Wireless communication systems using UWB technology typically employ data multiplexing for allowing multiple users or devices to share access to the communication system. Some wireless communications systems are designed to support simultaneous data transmission among multiple devices and multiple groups of devices. A group or network of devices having data connection among each other is sometimes referred to as a piconet. A piconet is a logical group of two or more devices communicating with each other, without interference from other piconets. An exemplary piconet may be a DVD player with a UWB wireless link to a television display.

In UWB systems, it is often advantageous to support as many simultaneously operating piconets as possible. Multiple piconets typically require that data packets or symbols from devices on each piconet are multiplexed in a manner so data packets from one piconet are not readable to other piconets.

Widely used forms of multiplexing include frequency division multiple access (FDMA), where signals or data streams are each modulated onto unique portions of spectrum, and time division multiple access (TDMA), where data packets from different users or devices are assigned unique time slots in the same portion of spectrum.

One approach to data multiplexing in a UWB system uses code division multiple access (CDMA), a direct-sequence spread-spectrum system also used in cellular telephony, wireless LAN, and many other applications. CDMA multiplies user data to be transmitted with a unique spreading code. Each user or device is given a unique spreading code to differentiate its data stream from other users or devices. At the receiver, the original data is recovered via de-spreading with this unique code.

Code Division Multiple Access (CDMA) systems commonly suffer from multiple-access interference (MAI). When a user is assigned multiple orthogonalizing codes, signal degradation can take the form of inter-symbol interference (ISI). MAI and ISI are typically reduced by selecting orthogonalizing codes having low cross-correlations. However, in order to achieve good spreading characteristics in a DS-CDMA system, it is necessary to employ sequences having a low average mean-square aperiodic autocorrelation for non-zero lags.

In practice, decoding errors are minimized by using distinctive multiple-access codes with suitable autocorrelation and cross-correlation properties. The cross-correlation between any two codes should be low for minimal interference between multiple users in a communications system or between multiple target reflections in radar and positioning applications. At the same time, it is desirable for the autocorrelation property of a multiple-access code to be steeply peaked, with small side-lobes. Maximally peaked code autocorrelation yields optimal acquisition and synchronization properties for communications, radar, and positioning applications.

Complementary codes, first introduced by Golay, are sets of finite sequences of equal length such that the number of pairs of identical elements with any given separation in one sequence is equal to the number of pairs of unlike elements having the same separation in the other sequences.

The complementary codes first discussed by Golay were pairs of binary complementary codes. If values of +1 and −1 are elements of Golay complementary sequences, then the sum of the autocorrelation functions of two Golay complementary sequences has zero sidelobes. For a length-N code, the sum of its respective autocorrelation sequences for the zero shift is equal to K·N (K being the number of code words in the set).

Polyphase complementary codes, described in R. Sivaswamy, "Multiphase Complementary Codes," IEEE TRANSACTIONS ON INFORMATION THEORY, VOL. IT-24, NO. 5, Sep. 1978, are codes where each element is a complex number of unit magnitude and arbitrary phase. In the IEEE 802.11b standard, complementary code elements include the set [1,−1, j,−j].

Unfortunately, favorable autocorrelation characteristics are typically achieved at the expense of cross-correlation characteristics, and vice versa. Thus, code selection typically involves a trade-off between autocorrelation and cross-correlation performance. It is advantageous to identify sets of spreading codes with autocorrelation and cross-correlation properties that facilitate identifying different piconets in an UWB network. There is also a need in the art to provide simple transmitter and receiver structures that are configurable for a large number of codes and codes that support different data rates.

SUMMARY OF THE INVENTION

Embodiments disclosed herein may be advantageous to systems employing UWB and CDMA signals. However, the invention is not intended to be limited to such systems, as other coded signals may benefit from similar advantages.

A Golay-code generator configured for generating Golay complementary code pairs comprises a delay means and an adaptable seed-vector insertion means. The delay means may include, by way of example, but without limitation, a sequence of delay elements configured for providing a predetermined set of fixed delays to at least a first input signal. The adaptable seed-vector insertion means may include, by way of example, but without limitation, a sequence of adaptable seed vector insertion elements configured for multiplying at least a second input signal by a variable seed vector, wherein each of a plurality of seed vectors corresponds to at least one predetermined piconet.

The Golay-code generator further comprise a multiplexing means configured for switching inputs and outputs of at least two delay elements in the sequence of delay elements to produce a plurality of compatible delay vectors. A multiplexing means may comprise a plurality of multiplexers coupled within the delay means and the seed-vector insertion means.

The Golay-code generator may further comprise a code-truncation means configured to shorten the Golay complementary code pairs for producing a plurality of daughter codes.

In one embodiment of the invention, the Golay-code generator may be configured as a component of a spreading means configured to spread a transmit signal with at least one Golay code. In an alternative embodiment, the Golay-code generator may be integrated into a matched filter in a receiver.

In another embodiment of the invention, a method for reducing peak-to-average power in an ultra-wideband communication signal comprises for generating a Golay complementary code pair comprising a first code and a second code, partitioning a symbol frame into a plurality of blocks comprising at least one even-numbered block and at least one odd-numbered block, and spreading each of the at least one even-numbered block with the first code and each of the at least one odd-numbered block with the second code.

Embodiments of the invention may be configurable for generating code sets, updating code sets, and/or reassigning user codes in response to demand for network resources, changes in the number of users accessing the network, individual user-access requirements, changes in signal-propagation characteristics (e.g., multipath, Doppler, path loss, etc.), and/or interference (e.g., ISI, MAI, jamming, etc.). Embodiments of the invention may provide for flexible code lengths, support multiple levels of Quality of Service, and/or allow for system overloading. Embodiments of the invention may be optimized for minimum processing complexity, such as to enable suitability for real-time applications, rapid updates, low power consumption, and/or low cost processing components. Particular embodiments of the invention may be configured to provide for the previously recited features and advantages and/or alternative features and advantages.

Although particular embodiments are described herein, many variations and permutations of these embodiments fall within the scope and spirit of the invention. Although some benefits and advantages of the preferred embodiments are mentioned, the scope of the invention is not intended to be limited to particular benefits, uses, or objectives. Rather, embodiments of the invention are intended to be broadly applicable to different wireless technologies, system configurations, networks, and transmission protocols, some of which are illustrated by way of example in the figures and in the following description of the preferred embodiments. The detailed description and drawings are merely illustrative of the invention rather than limiting, the scope of the invention being defined by the appended claims and equivalents thereof.

BRIEF DESCRIPTION OF THE DRAWINGS

Embodiments according to the present invention are understood with reference to the following figures.

FIG. 9A shows a set of self-synchronized scramblers for use in at least one piconet.

FIG. 9B illustrates a set of self-synchronized descramblers.

FIG. 10A illustrates a method for providing a UWB frame format that allows both open-loop and close-loop control to be used.

FIG. 10B shows a reception method in accordance with an embodiment of the invention.

FIG. 10C illustrates a frame format in accordance with one embodiment of the invention.

DESCRIPTION OF PREFERRED EMBODIMENTS

Figure 1:
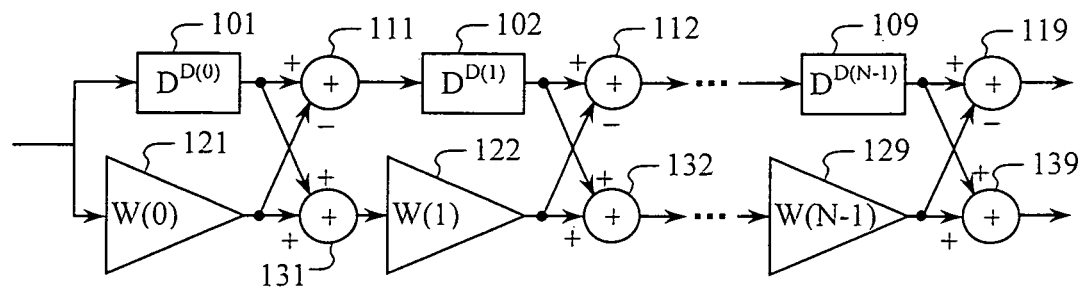
FIG. 1 is a diagram of a code generator configured to generate Golay complementary code pairs according to one embodiment of the invention.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the spirit and scope of the invention as defined by the claims.

In accordance with one embodiment of the invention, a set of spreading codes is provided with autocorrelation and cross-correlation properties that are advantageous for identifying different piconets in an UWB network. For example, a set of six Golay complementary code pairs may be employed, and each piconet may be assigned one code pair.

FIG. 1 is a diagram of a code generator configured to generate Golay complementary code pairs according to one embodiment of the invention. The code generator comprises a sequence of delay elements 101-109 configured for providing a predetermined set of fixed delays D=[D(0), D(1), ..., D(N−1)] to a first input signal. In this case, the delay profile provided by the delay elements 101-109 is fixed, even when the code generator is configured to produce multiple Golay complementary code pairs.

The code generator further comprises a sequence of adaptable seed vector insertion elements 121-129 configured for multiplying a second input signal by at least one of a plurality of different seed vectors $W^i=[W^i(0), W^i(1), \ldots, W(N-1)]$, $i=1, \ldots, L$, where L is the number of piconets, and, thus, code pairs. The seed vectors may include any combination of binary and complex symbols. For binary codes, $W(k)=\pm 1$. For complex codes, $W(k)=\pm 1$ and $\pm j$.

The seed vector insertion elements 121-129 are programmable such that the seed vector, and the resulting Golay complementary code pair, is different for each of a plurality of piconets. Each of the plurality of seed vectors may correspond to at least one predetermined piconet. Furthermore, a first set of combiners 111-119 and a second set of combiners 131-139 are configured for combining delayed signals with signals multiplied by the seed vector.

In one embodiment, a set of six Golay code pairs is generated using a delay vector D=[32, 8, 2 16, 1, 4] and the following seed vectors:

$W^1$=[+1, +1, −j, +j, −j, +1]
$W^2$=[+1, +1, −1, +1, +j, +j]
$W^3$=[−j, +1, +1, −1, −1, +j]
$W^4$=[+j, +j, −j, −1, +1, +1]
$W^5$=[−1, +1, −1, −1, +j, +j]
$W^6$=[+j, +1, +1, −1, −1, +j]

The periodic cross correlation between the resulting Golay complementary codes is less that 16, and the periodic autocorrelation function has a zero-correlation zone (i.e., no side lobes) around the main correlation peak. Since the same delay vector is used to generate all six codes, and only the seed vector is configurable, code generators configured to generate different Golay complementary code pairs may share the same hardware configuration. Similarly, a code generator having a fixed hardware configuration may be programmable for generating pair codes for all piconets.

The first and second input signals may include a Dirac impulse signal. The output comprises the complex-conjugate Golay pair codes in reverse order. For example, the code generator may produce Golay complementary code pairs that are mother codes ($a^i_{64}$, $b^i_{64}$) of length 64.

In a low-data-rate mode, the mother code pairs may be used to spread all fields in a frame. For example, a spreading module may comprise a spreader (not shown) and the code generator shown in FIG. 1. Mother-code pairs generated by the code generator are used to spread the preamble, header, and data fields in the frame.

Figure 2:
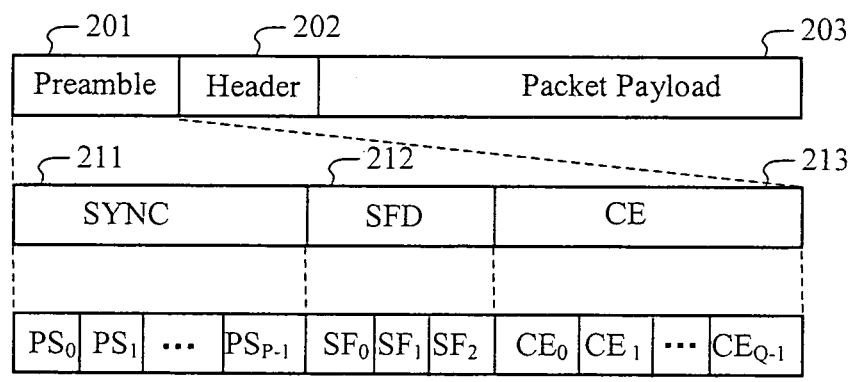
FIG. 2 shows an UWB frame structure that may be employed by embodiments of the invention.

FIG. 2 shows an UWB frame structure that may be employed by embodiments of the invention. A frame comprises a preamble 201, header 202, and packet payload 203. The preamble comprises a packet sync sequence field 211, a start-frame delimiter field 212, and a channel-estimation sequence field 213. The sync sequence 211 is a repetition of ones spread by Golay codes $a^i_{64}$ and/or $b^i_{64}$. The start-frame delimiter field 212 comprises a sequence {1 −1 1 −1 . . . } spread by $a^i_{64}$ and/or $b^i_{64}$. The channel-estimation field 213 may be spread using $a^i_{64}$ and/or $b^i_{64}$. In one embodiment, the channel-estimation sequence is formed by repetition of code $a^i_{64}$ followed by a repetition of code $b^i_{64}$. The header and data fields 202 and 203 may be binary or complex-valued, and spread using $a^i_{64}$ and/or $b^i_{64}$. Thus, embodiments of the invention may provide for employing a single spreader for spreading all fields in the frame.

Figure 3:
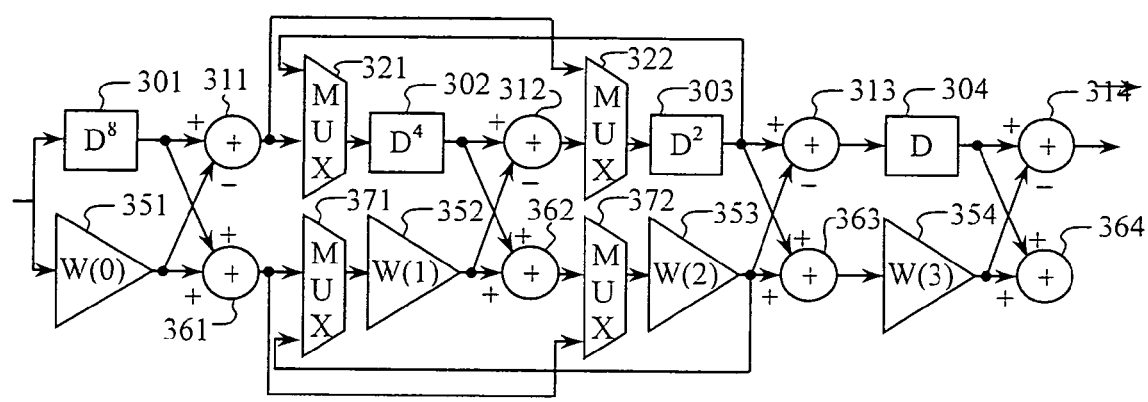
FIG. 3 is a diagram of a Golay-code generator configured for generating Golay complementary code pairs in accordance with an embodiment of the invention.

FIG. 3 illustrates a Golay-code generator configured for generating Golay complementary code pairs comprising a sequence of delay elements 301-304, a set of seed vector insertion elements 351-354, and a plurality of multiplexers 321, 322, 371, and 372. The sequence of delay elements 301-304 is configured for providing a predetermined set of fixed delays to at least a first input signal and at least one scaled signal for producing a plurality of delayed signals. The set of seed vector insertion elements 351-354 is configured for multiplying at least one input signal and at least one of the delayed signals by a programmable seed vector for producing at least one scaled signal. Furthermore, a first set of combiners 301-304 and a second set of combiners 361-364 are configured for combining delayed signals with scaled signals.

Each seed vector enables the code generator to generate a unique code pair corresponding to at least one predetermined piconet. However, the plurality of multiplexers 321, 322, 371, and 372 configures the delay elements to provide for a plurality of delay vectors, thus increasing the possible number of code pairs the generator can produce. For example, the multiplexers 321 and 322 provide for switching the inputs and outputs of delay elements 302 and 304, which produces a pair of compatible delay vectors. Compatible delay vectors are defined as a pair of delay vectors having identical delay-element values in which only two of the delay element values are swapped. For example, delay vectors $D_1$=[8, 4, 2, 1] and $D_2$=[8, 2, 4, 1] are compatible delay vectors.

The Golay-code generators shown in FIG. 1 and FIG. 3 may be configurable for producing Golay code pairs of different lengths. Specifically, sets of codes of different lengths having good autocorrelation and cross-correlation properties may be generated to support multiple data rates. Thus, each piconet may be provided with a code having a programmable length.

Figure 4:
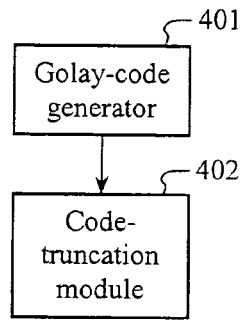
FIG. 4 illustrates a Golay-code generator configured to produce programmable-length codes.

FIG. 4 illustrates a Golay-code generator configured to produce programmable-length codes. A code generator 401, such as the code generator shown in FIG. 1 or FIG. 3, further comprises a code-truncation module 402. In this case, the code generator's 401 sequence of adaptable seed vector insertion elements is further configured for setting at least one seed-vector element value to zero. The code-truncation module 402 is configured to shorten the output Golay complementary code pairs (with respect to how many seed vector elements are set to zero) for producing a plurality of Golay complementary daughter code pairs, which may have different spreading lengths. Thus, the Golay-code generator shown in FIG. 4 can be used to generate all mother codes and daughter codes.

In one embodiment of the invention, the Golay-code generator shown in FIG. 4 may be configured to produce a mother code of length 8 with a delay profile D=[8 4 2 1] and a seed vector W=[1 −1 1]. The resulting Golay code pairs are:
$a_8$=[+1 −1 −1 −1 −1 +1 −1 −1] and
$b_8$=[−1 −1 +1 −1 +1 +1 +1 −1].

The Golay-code generator may be further configured to produce a daughter code of length 4 with the same delay vector and a seed vector with the first element set to zero. For example, the seed vector W=[0 1 −1] may be used to generate the following Golay code pairs:
$a_{4'}$=[+1 +1 +1 −1 0 0 0 0] and
$b_{4'}$=[−1 +1 −1 −1 0 0 0 0].

By removing the zeros, daughter codes of length 4 are produced:
$a_4$=[+1 +1 +1 −1] and
$b_4$=[−1 +1 −1 −1].

Transmitter embodiments and receiver matched-filter embodiments of the invention may include any of the Golay-code generators described herein.

Figure 5:
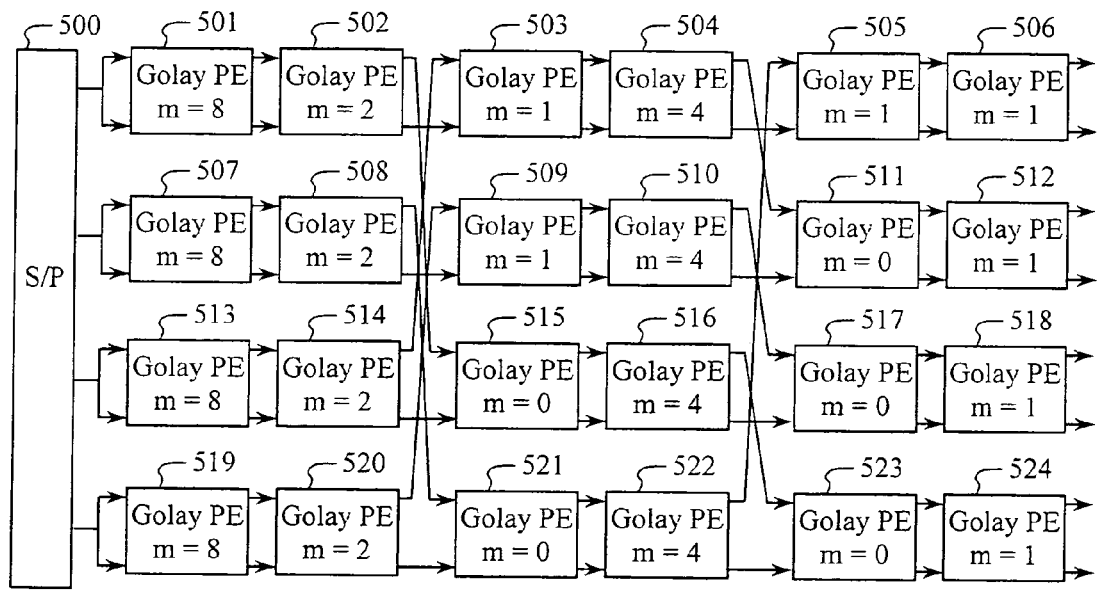
FIG. 5 shows a matched-filter circuit in accordance with an embodiment of the invention.

FIG. 5 shows a matched-filter circuit in accordance with an embodiment of the invention. A serial-to-parallel converter (S/P) 500 converts a received digital sequence into a plurality of parallel symbol streams. A plurality of Golay processing elements 501-524 provide for matched-filtering the received signal.

Embodiments of the invention may be configured for matched filtering Golay complementary code pairs having a common length or different lengths. The matched filter may be configured for processing all mother codes and/or daughter codes used by a plurality of piconets. In such embodiments, the matched filter may be configurable by programming at least one seed vector. Furthermore, the matched filter may be configured for decoding an entire frame, comprising a preamble, header, and packet payload.

Figure 6:
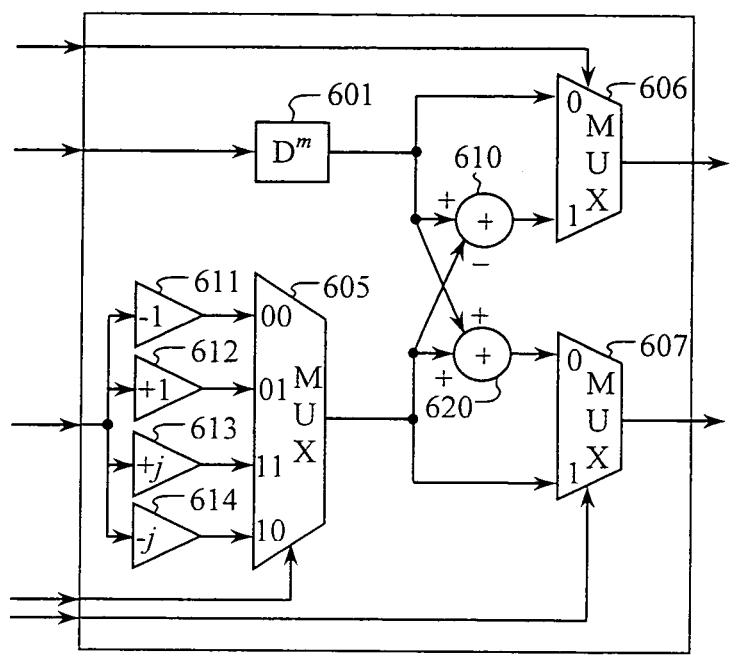
FIG. 6 is a block diagram of a Golay processing element.

FIG. 6 is a block diagram of one of the Golay processing elements 501-524 shown in FIG. 5. A first signal input is coupled to a delay element 601. A second signal input is coupled to a set of seed-vector insertion elements 611-614. A first multiplexer 605 is configured in one of the positions "00", "01", "11", or "10" depending on whether the current seed-vector value is −1, +1, +j, or −j, respectively. Multiplexers 606 and 607 are configured with respect to code length. For example, Multiplexers 606 and 607 are both in position "1" for a 64-length code and position "0" for a 32-length code.

The circuit is an exemplary implementation with a parallelism factor of four. The outputs represent a polyphase decomposition of the matched filter to Golay code pairs a and b. However, alternative embodiments of the invention may comprise different circuit configurations.

Figure 7A:
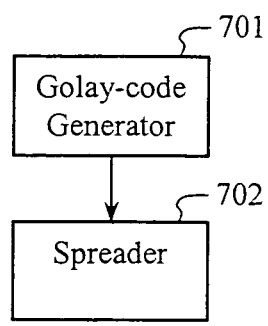
FIG. 7A is a block diagram of a spreading module.

FIG. 7A is a block diagram of a spreading module comprising a Golay-code generator 701 and a spreader 702. The Golay-code generator 701 is configured for generating a Golay complementary code pair comprising Golay codes a and b. In this case, the Golay codes are complementary (i.e., they are generated from the same delay vector and seed vector). The spreader 702 further comprises a frame-partitioning module (not shown) configured for partitioning a symbol frame into a plurality of blocks comprising even-numbered and odd-numbered blocks. The blocks can be sets of one or more symbols. The spreader 702 spreads each even-numbered block with one of the codes a or b and each odd-numbered block with the other code b or a.

Figure 7B:
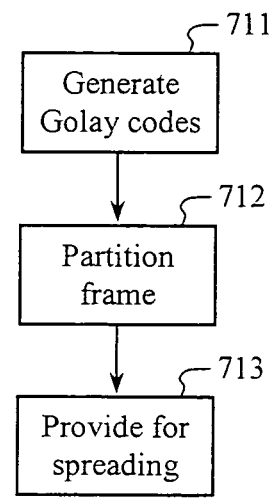
FIG. 7B illustrates a method for spreading a transmission with a Golay code.
Figure 7C:
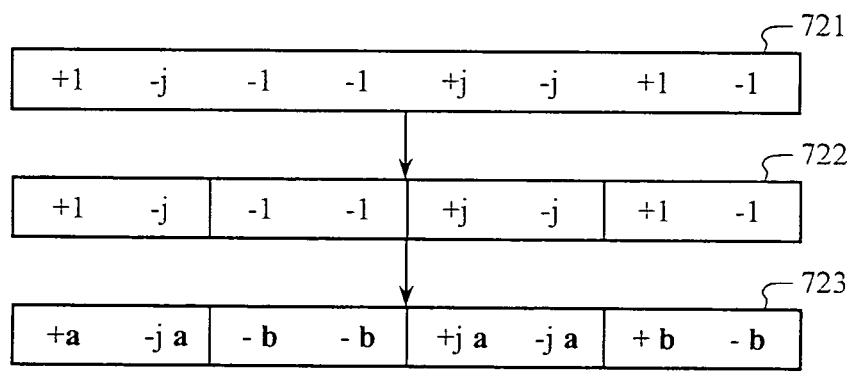
FIG. 7C illustrates a data block that is partitioned and spread with a set of complementary Golay codes.

FIGS. 7B and 7C illustrate a method for spreading a transmission with a Golay code. The method comprises generating 711 a Golay complementary code pair comprising a first code and a second code, partitioning 712 a symbol frame 721 into a plurality of blocks 722 comprising even-numbered blocks and odd-numbered blocks, and spreading each of the even-numbered block with the first code and each of the odd-numbered block with the second code for producing alternating spread blocks 723.

Figure 8A:
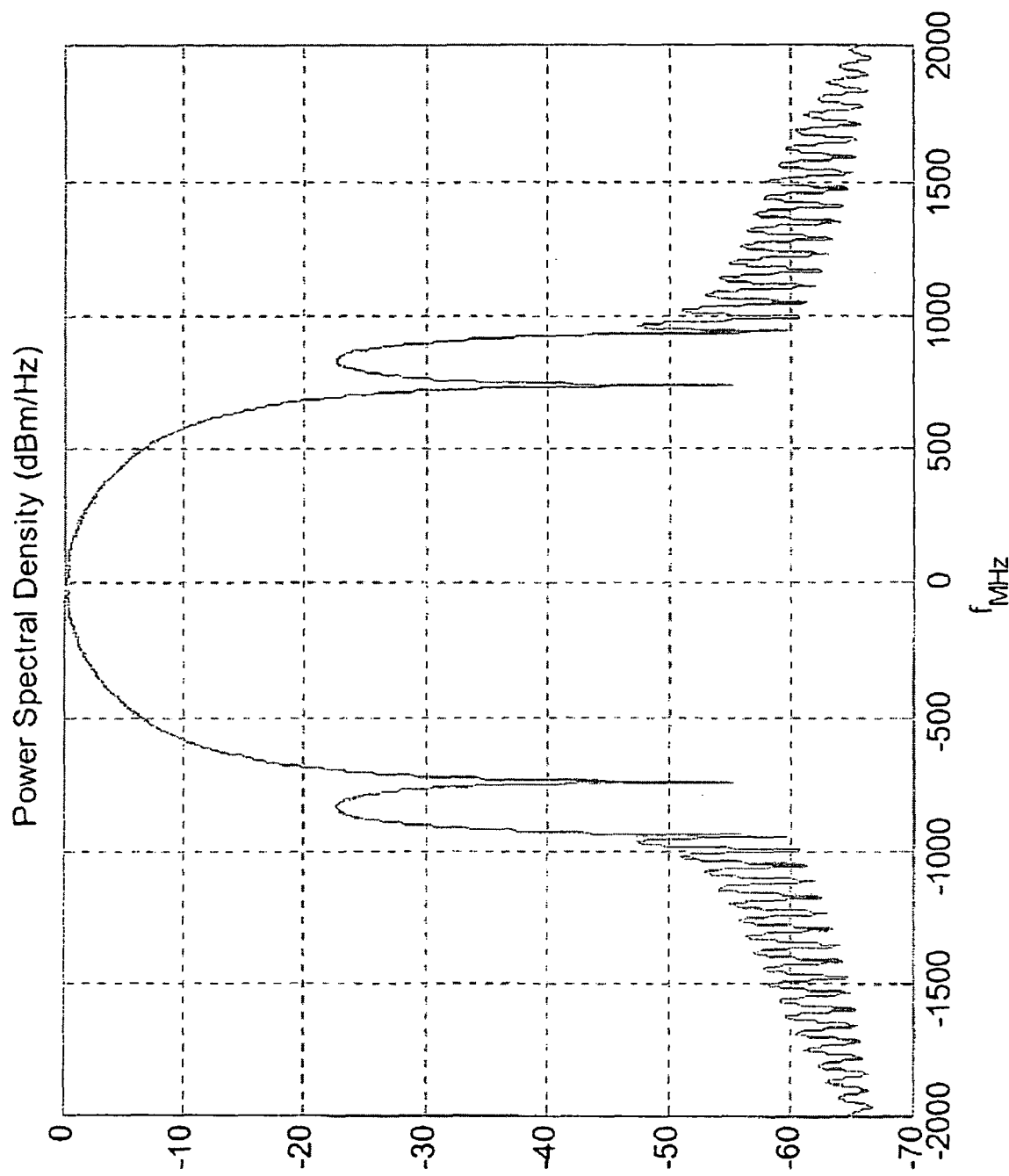
FIG. 8A shows the spectrum of a UWB system in which a transmission is spread with a BPSK code [1 1].
Figure 8B:
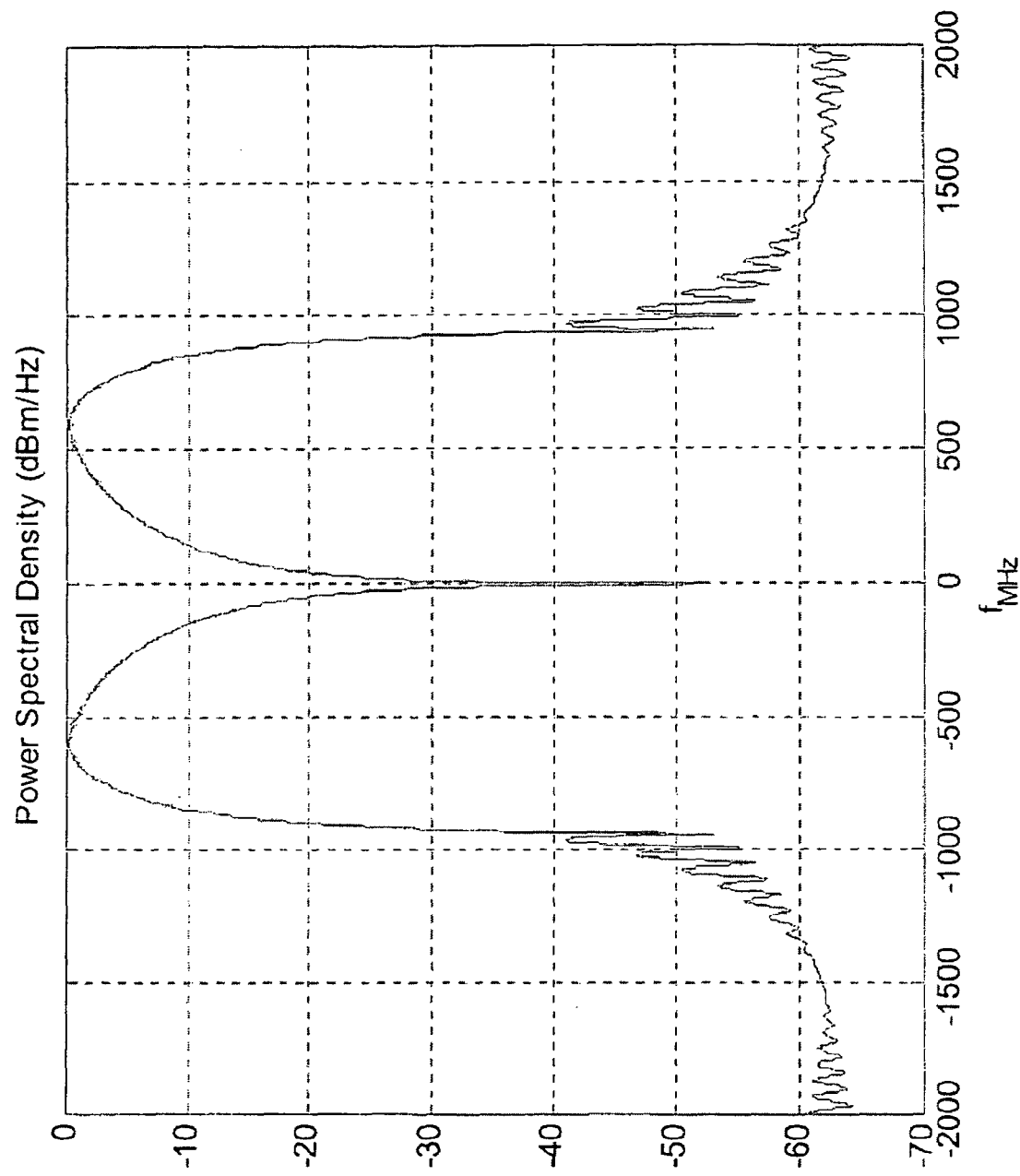
FIG. 8B shows the spectrum of a UWB signal spread with the complementary BPSK code [1 −1].
Figure 8C:
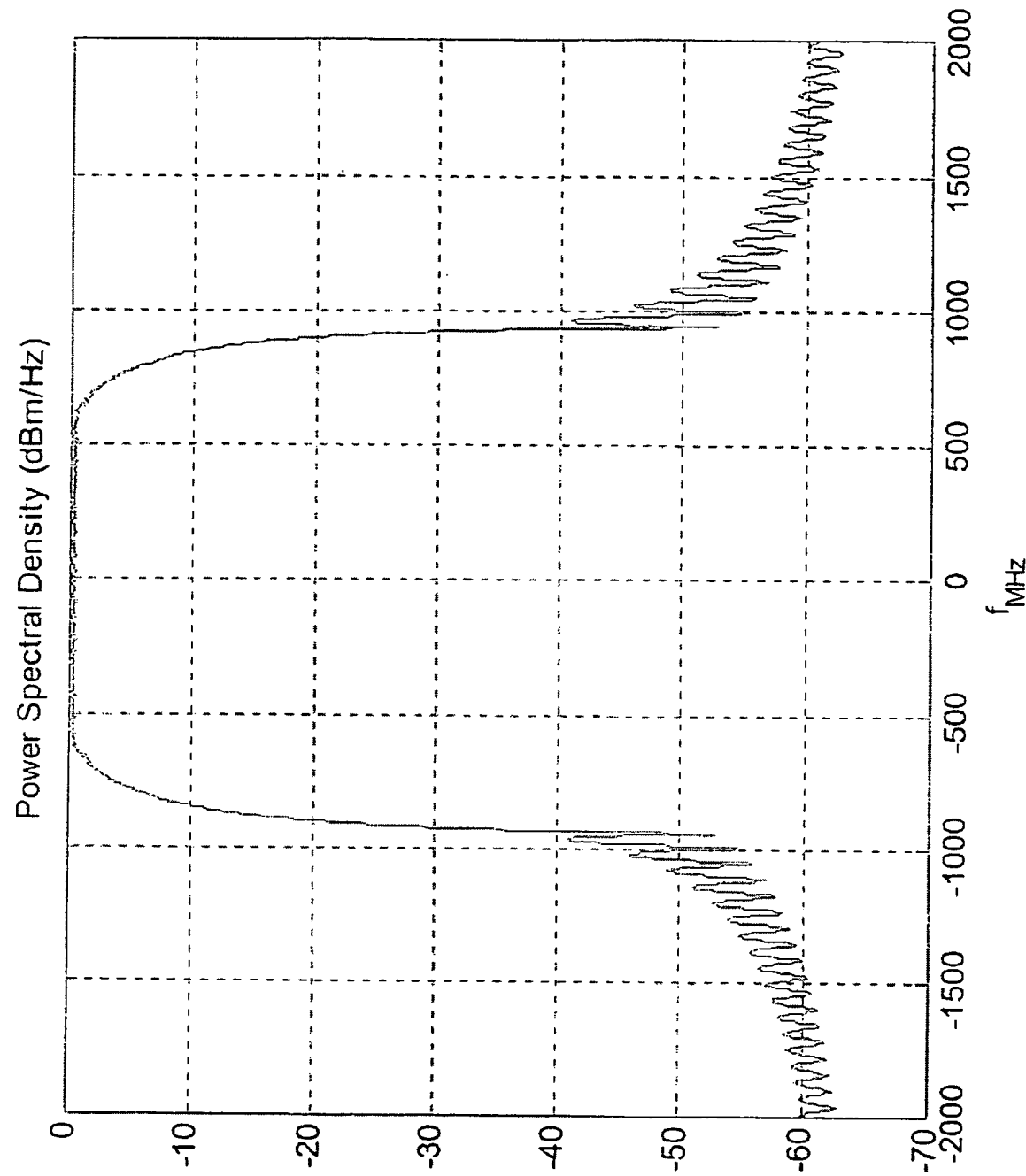
FIG. 8C shows the spectrum of a UWB signal when alternating spreading codes [1 1] and [−1 1] are used.

Partitioning a symbol frame into a plurality of blocks and spreading the blocks with complementary codes a or b flattens the spectrum, thus reducing amplifier back-off. This is because the sum of the autocorrelation of complementary codes a or b has zero sidelobe levels. FIG. 8A shows the spectrum of a UWB system in which a transmission is spread with a BPSK code [1 1]. The resulting spectrum is not flat, and requires the transmitter to employ a back-off of 3.3 dB to meet FCC requirements. FIG. 8B shows the spectrum of a UWB signal spread with the complementary BPSK code [1 −1]. FIG. 8C shows the resulting flat spectrum when alternating spreading codes [1 1] and [−1 1] are used.

FIG. 9A shows a set of self-synchronized scramblers for use in at least one piconet for whitening the spectrum and reducing the peak-to-average power of the transmitted waveform. The set of self-synchronized scramblers comprises a first scrambling-code generator configured for generating a first scrambling code expressed by $(1)^{fix(n/m)}$, a second scrambling-code generator configured for generating a second scrambling code expressed by $(-1)^{fix(n/m)}$, a third scrambling-code generator configured for generating a third scrambling code expressed by $(i)^{fix(n/m)}$, and a fourth scrambling-code generator configured for generating a fourth scrambling code expressed by $(-i)^{fix(n/m)}$, wherein n is an integer sequence, m is a periodicity factor, and fix( ) returns the integer portion of n/m. If different piconets use different scramblers from the set, interference-rejection is improved and the same spreading codes can be used by all piconets. FIG. 9B illustrates a corresponding set of descramblers.

One embodiment of the invention comprises a signaling mode that supports use of both open-loop and close-loop control. An open-loop receiver architecture allows for low-speed tracking of timing signals, frequency, and channel impulse response, thus providing for low power, low complexity, and a small processor chip size. A closed-loop receiver architecture can improve receiver performance, but typically results in higher power consumption and cost.

FIG. 10A illustrates a method for providing a UWB frame format that allows both open-loop and close-loop control to be used. The method comprises fragmenting 1001 a data frame into a plurality of blocks, generating 1002 a Golay code pair, and inserting 1003 the at least one Golay code in each of the plurality of blocks for producing a plurality of inserted Golay codes.

In one embodiment, the plurality of blocks comprises even-numbered blocks and odd-numbered blocks, and the Golay code pair comprises a first Golay complementary code and a second Golay complementary code. The first Golay complementary code is inserted behind each even-numbered block and the second Golay complementary code is inserted behind each odd-numbered block. In one embodiment, mother or daughter Golay codes $a_{64}$ and $b_{64}$ may be used.

In an alternative embodiment of the invention, the first Golay complementary code is inserted inside each even-numbered block and the second Golay complementary code is inserted inside each odd-numbered block. Thus, apparatus embodiments shown herein may comprise a Golay-code generator configured to generate inserted Golay codes comprising Golay codes inserted between the blocks and/or inside the blocks. Codes inserted between blocks may be positioned to precede or follow particular blocks. The Golay codes may be provided with a cyclic prefix and/or a cyclic postfix.

Embodiments of the invention may provide for dithering the inserted Golay codes, such as by cyclically shifting the codes or by zero insertion. Such techniques may be performed for the purpose of flattening the spectrum, reducing peak-to-average power, and/or providing for improved interference rejection. However, the scope of the invention is not defined by particular benefits that may be achieved.

A receiver may be configured for processing a received transmission signal generated according to the method shown in FIG. 10A. The received signal comprises a data frame fragmented into a plurality of blocks, wherein each block comprises one of a plurality of inserted Golay codes. A reception method shown in FIG. 10B comprises providing for matched-filtering 1004 each of the plurality of inserted Golay codes for producing a matched-filtered output, and accumulating 1005 the matched-filtered output for use as a channel impulse response. FIG. 10C illustrates a frame format in accordance with one embodiment of the invention.

Figure 11:
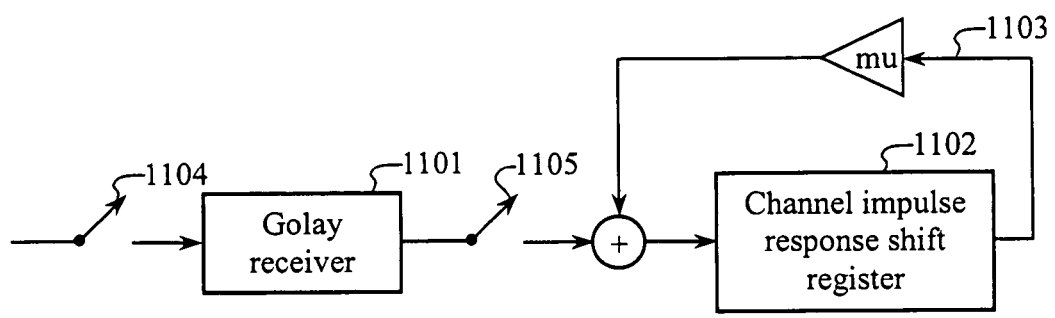
FIG. 11 is a block diagram of a circuit configured for performing channel tracking.

FIG. 11 is a block diagram of a circuit configured for performing channel tracking comprising a Golay receiver 1101 and a shift register 1102 with a feedback loop 1103. The circuit is configured for processing a received transmission comprising a data frame fragmented into a plurality of blocks, wherein each block is followed by one of a plurality of known Golay codes. The Golay receiver 1101 is configured for matched-filtering each of the plurality of known Golay codes for producing a matched-filtered output, and the shift register 1102 accumulates the matched-filtered output for use as a channel impulse response. Switches 1104 and 1105 are closed upon reception of the known Golay codes between the blocks.

Figure 12:
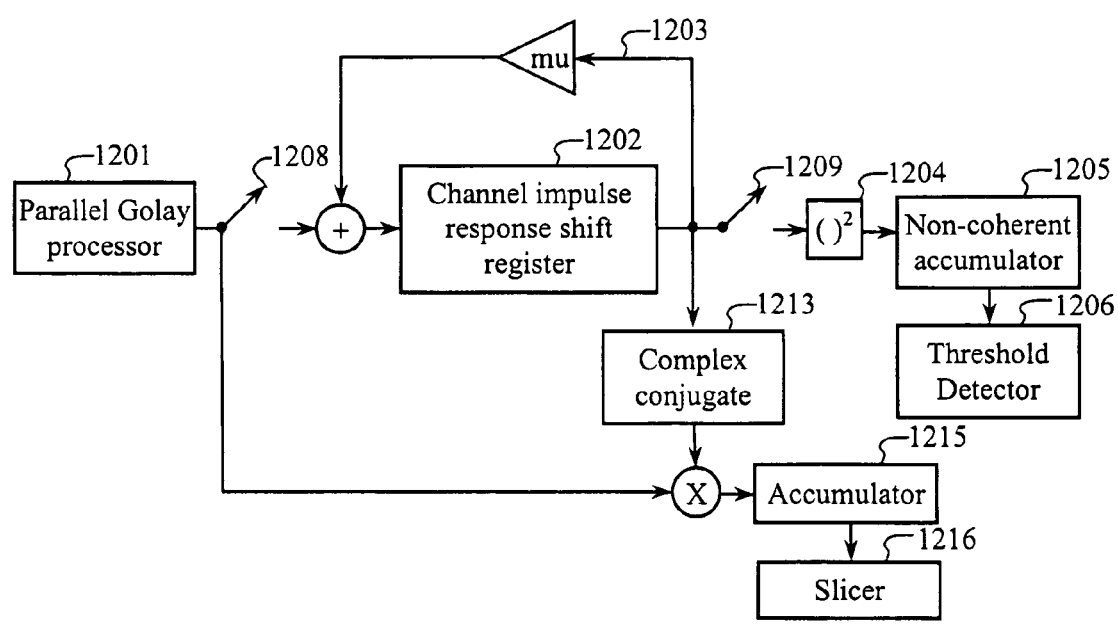
FIG. 12 is a block diagram of a packet detector.

FIG. 12 is a block diagram of a packet detector, comprising a parallel Golay processor 1201, a channel impulse response shift register 1202 with a feedback loop 1203, a squarer 1204, a non-coherent accumulator 1205, and a threshold detector 1206. The parallel Golay processor 1201, which may have the form of the matched-filter circuit shown in FIG. 5, despreads a received signal for producing a despread signal. The channel impulse response shift register 1202 is configured for accumulating the despread signal for use as a channel impulse response. A switch 1209 samples the output of the channel impulse response shift register 1202 for a predetermined number of codes for producing a sampled signal. The squarer 1204 processes the sampled signal to calculate signal power. The non-coherent accumulator 1205 non-coherently accumulates the despread-signal power for producing an accumulated output signal, and the threshold detector 1206 compares the accumulated output signal to a predetermined threshold for determining the presence or absence of a piconet signal.

The scope of the invention should not be interpreted as being limited to the type of ordering illustrated in the embodiments. Rather, the Applicants anticipate that alternative codeset orderings may be implemented, and that such orderings fall within the scope and spirit of the invention.

It should be appreciated that the apparatus and method embodiments of the invention may be implemented using a variety of hardware and software. For example, a Golay-code generator may be implemented using special-purpose hardware, such as an application specific integrated circuit (ASIC) and programmable logic devices such as gate arrays, and/or software or firmware running on a computing device, such as a microprocessor, microcontroller or digital signal processor (DSP). It also will be appreciated that although functions of the Golay-code generator may be integrated in a single device, such as a single ASIC, they may also be distributed among several devices.

The invention is not intended to be limited to the preferred embodiments. Furthermore, those skilled in the art should recognize that the method and apparatus embodiments described herein may be implemented in a variety of ways, including implementations in hardware, software, firmware, or various combinations thereof. Examples of such hardware may include ASICs, Field Programmable Gate Arrays, general-purpose processors, DSPs, and/or other circuitry. Software and/or firmware implementations of the invention may be implemented via any combination of programming languages, including Java, C, C++, Matlab™, Verilog, VHDL, and/or processor specific machine and assembly languages.

Computer programs (i.e., software and/or firmware) implementing the method of this invention may be distributed to users on a distribution medium, such as a SIM card, a USB memory interface, or other computer-readable memory adapted for interfacing with a wireless terminal. Similarly, computer programs may be distributed to users via wired or wireless network interfaces. From there, they will often be copied to a hard disk or a similar intermediate storage medium. When the programs are to be run, they may be loaded either from their distribution medium or their intermediate storage medium into the execution memory of a wireless terminal, configuring an onboard digital computer system (e.g. a microprocessor) to act in accordance with the method of this invention. All these operations are well known to those skilled in the art of computer systems.

The term "computer-readable medium" encompasses distribution media, intermediate storage media, execution memory of a computer, and any other medium or device capable of storing for later reading by a digital computer system a computer program implementing the method of this invention.

Various digital computer system configurations can be employed to perform the method embodiments of this invention, and to the extent that a particular system configuration is capable of performing the method embodiments of this invention, it is equivalent to the representative system embodiments of the invention disclosed herein, and within the scope and spirit of this invention.

Once digital computer systems are programmed to perform particular functions pursuant to instructions from program software that implements the method embodiments of this invention, such digital computer systems in effect become special-purpose computers particular to the method embodiments of this invention. The techniques necessary for this programming are well known to those skilled in the art of computer systems.

Various embodiments of the invention may include variations in system configurations and the order of steps in which methods are provided. In many cases, multiple steps and/or multiple components may be consolidated.

The method and system embodiments described herein merely illustrate particular embodiments of the invention. It should be appreciated that those skilled in the art will be able to devise various arrangements, which, although not explicitly described or shown herein, embody the principles of the invention and are included within its spirit and scope. Furthermore, all examples and conditional language recited herein are intended to be only for pedagogical purposes to aid the reader in understanding the principles of the invention. This disclosure and its associated references are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be appreciated by those skilled in the art that the block diagrams herein represent conceptual views of illustrative circuitry, algorithms, and functional steps embodying principles of the invention. Similarly, it should be appreciated that any flow charts, flow diagrams, signal diagrams, system diagrams, codes, and the like represent various processes that may be substantially represented in computer-readable medium and so executed by a computer or processor, whether or not such computer or processor is explicitly shown.

The functions of the various elements shown in the drawings, including functional blocks labeled as "processors" or "systems," may be provided through the use of dedicated hardware as well as hardware capable of executing software in association with appropriate software. When provided by a processor, the functions may be provided by a single dedicated processor, by a shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, the function of any component or device described herein may be carried out through the operation of program logic, through dedicated logic, through the interaction of program control and dedicated logic, or even manually, the particular technique being selectable by the implementer as more specifically understood from the context.

Any element expressed herein as a means for performing a specified function is intended to encompass any way of performing that function including, for example, a combination of circuit elements which performs that function, or software in any form, including, therefore, firmware, micro-code or the like, combined with appropriate circuitry for executing that software to perform the function. Embodiments of the invention as described herein reside in the fact that the functionalities provided by the various recited means are combined and brought together in the manner which the operational descriptions call for. Applicant regards any means that can provide those functionalities as equivalent to those shown herein.

The invention claimed is:

1. An apparatus for generating at least one Golay complementary code pair comprising:
   a sequence of delay elements configured to delay at least a first input signal,
   a sequence of adaptable seed vector insertion elements configured to multiply at least a second input signal by at least one of a plurality of seed vectors corresponding to at least one piconet, and to set at least one element of the at least one of the plurality of seed vectors to zero,
   a plurality of combiners configured to combine the delayed at least first input signal and the multiplied at least second input signal to produce the at least one Golay complementary code pair, and
   a code-truncation module configured to shorten the at least one Golay complementary code pair to produce a plurality of daughter codes.

2. The apparatus recited in claim 1 configured to process a Dirac impulse as the first and second input signals.

3. The apparatus recited in claim 1 wherein the at least one Golay complementary code pair comprises a plurality of codes having a periodic cross correlation less than 16 and a periodic autocorrelation function with a main correlation peak and no side lobes around the main correlation peak.

4. The apparatus recited in claim 1, wherein the sequence of adaptable seed vector insertion elements is configured to generate all Golay code pairs for a set of piconets.

5. The apparatus recited in claim 1, wherein the at least one Golay complementary code pair comprises mother codes.

6. The apparatus recited in claim 1, wherein the sequence of adaptable seed vector insertion elements is configured to generate at least one of a set of seed vectors, the set comprising binary-valued seed vectors and complex-valued seed vectors.

7. A method for generating at least one Golay complementary code pair, the method comprising:
   delaying at least a first input signal with respect to a delay profile,
   multiplying at least a second input signal by at least one of a plurality of seed vectors corresponding to at least one piconet,
   setting at least one element of the at least one of the plurality of seed vectors to zero,
   combining the delayed at least first input signal and the multiplied at least second input signal to produce the at least one Golay complementary code pair, and
   shortening the at least one Golay complementary code pair to produce a plurality of daughter codes.

8. The method recited in claim 7 configured to process a Dirac impulse as the first and second input signals.

9. The method recited in claim 7, wherein the at least one Golay complementary code pair comprises a plurality of codes having a periodic cross correlation less than 16 and a periodic autocorrelation function with a main correlation peak and no side lobes around the main correlation peak.

10. The method recited in claim 7, wherein multiplying the at least second input signal by the at least one of a plurality of seed vectors comprises generating a plurality of Golay-code pairs for a set of piconets.

11. The method recited in claim 7, wherein the at least one Golay complementary code pair comprises mother codes.

12. The method recited in claim 7, wherein multiplying the at least second input signal by the at least one of a plurality of seed vectors comprises generating at least one of a set of seed vectors, the set comprising binary-valued seed vectors and complex-valued seed vectors.

13. An apparatus for generating Golay complementary code pairs comprising:
   a sequence of delay elements configured to delay at least a first input signal,
   a set of seed vector insertion elements configured to multiply at least a second input signal by at least one of a plurality of seed vectors corresponding to at least one piconet,
   a plurality of combiners configured to combine the delayed at least first input signal and the multiplied at least second input signal to produce the Golay complementary code pairs, and
   a plurality of multiplexers configured to switch inputs and outputs of at least two delay elements in the sequence of delay elements to produce a plurality of compatible delay vectors.

14. A method for generating Golay complementary code pairs, the method comprising:
   delaying at least a first input signal with respect to at least one of a set of compatible delay vectors using a sequence of delay elements,
   multiplying at least a second input signal by at least one of a plurality of seed vectors corresponding to at least one piconet,
   combining the delayed at least first input signal and the multiplied at least second input signal to produce the Golay code complementary code pairs, and
   switching inputs and outputs of at least two delay elements in the sequence of delay elements to select at least one of the set of compatible delay vectors.

15. A matched filter for processing Golay complementary code pairs, the matched filter comprising:
   a plurality of Golay processing elements, each of the processing elements comprising:
      at least one delay element configured to delay at least a first input signal,
      a set of seed vector insertion elements configured to multiply at least a second input signal by a plurality of seed-vector values for producing at least one of a plurality of scaled input signal values,
      at least a first multiplexer coupled to the set of seed vector insertion elements, the at least first multiplexer configured to select the at least one of the plurality of scaled input signal values, and
      at least a second multiplexer comprising a plurality of inputs coupled to the at least one delay element and the at least first multiplexer, the at least second multiplexer configured to select at least one of the plurality of inputs in response to at least one code length of the Golay complementary code pairs.

16. The matched filter recited in claim 15, configured to process at least one of a set of codes, the set comprising same-length codes and different-length codes.

17. A matched-filtering method for processing Golay complementary code pairs, the method comprising:
   delaying at least a first input signal, multiplying at least a second input signal by a plurality of seed-vector values for producing at least one of a plurality of scaled input signal values, selecting the at least one of the plurality of scaled input signal values, and selecting at least one of the delayed at least first input signal and the selected at least one of the plurality of scaled input signal values in response to at least one code length of the Golay complementary code pairs.

18. The method recited in claim 17, wherein the Golay complementary code pairs comprise at least one of a set of codes, the set comprising a binary code and a complex code.

19. An apparatus for generating at least one Golay complementary code pair comprising:
   means for delaying an input signal with respect to a fixed delay profile, and
   means for adaptively employing at least one of a plurality of seed vectors corresponding to at least one predetermined piconet.

20. A computer readable storage media comprising instructions executable to cause an apparatus to generate at least one Golay complementary code pair by:
   delaying an input signal with respect to a fixed delay profile, and
   adaptively employing at least one of a plurality of seed vectors corresponding to at least one predetermined piconet.

21. An apparatus for generating Golay complementary code pairs comprising:
   means for delaying an input signal with respect to at least one of a set of compatible delay vectors,
   means for employing at least one of a plurality of seed vectors corresponding to at least one predetermined piconet, and
   means for switching inputs and outputs of at least two delay elements in a sequence of delay elements to select at least one of the set of compatible delay vectors.

22. A computer readable storage media comprising instructions executable to cause an apparatus to generate Golay complementary code pairs by:
   delaying an input signal with respect to at least one of a set of compatible delay vectors,
   employing at least one of a plurality of seed vectors corresponding to at least one predetermined piconet, and
   switching inputs and outputs of at least two delay elements in a sequence of delay elements to select at least one of the set of compatible delay vectors.

23. An apparatus for processing Golay complementary code pairs comprising:
   means for delaying at least a first input signal,
   means for multiplying at least a second input signal by a plurality of seed-vector values for producing at least one of a plurality of scaled input signal values,
   means for selecting the at least one of the plurality of scaled input signal values, and
   means for being responsive to at least one code length of the Golay complementary code pairs.

24. A computer readable storage media comprising instructions executable to cause an apparatus to process Golay complementary code pairs by:
   delaying at least a first input signal,
   multiplying at least a second input signal by a plurality of seed-vector values for producing at least one of a plurality of scaled input signal values,
   selecting the at least one of the plurality of scaled input signal values, and
   being responsive to at least one code length of the Golay complementary code pairs.

* * * * *